(12) United States Patent
Nozawa et al.

(10) Patent No.: US 10,145,014 B2
(45) Date of Patent: Dec. 4, 2018

(54) FILM FORMING APPARATUS

(71) Applicant: TOKYO ELECTRON LIMITED, Tokyo (JP)

(72) Inventors: Toshihisa Nozawa, Miyagi (JP); Masahide Iwasaki, Miyagi (JP); Toshihiko Iwao, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 198 days.

(21) Appl. No.: 14/416,418

(22) PCT Filed: Apr. 17, 2013

(86) PCT No.: PCT/JP2013/061407
§ 371 (c)(1),
(2) Date: Jan. 22, 2015

(87) PCT Pub. No.: WO2014/017132
PCT Pub. Date: Jan. 30, 2014

(65) Prior Publication Data
US 2015/0211124 A1    Jul. 30, 2015

(30) Foreign Application Priority Data
Jul. 25, 2012   (JP) .................................. 2012-164830

(51) Int. Cl.
*C23C 16/00* (2006.01)
*C23F 1/00* (2006.01)
(Continued)

(52) U.S. Cl.
CPC .......... *C23C 16/511* (2013.01); *C23C 16/455* (2013.01); *C23C 16/45536* (2013.01);
(Continued)

(58) Field of Classification Search
USPC ............. 118/715–733, 723 MW; 156/345.41
See application file for complete search history.

(56) References Cited

U.S. PATENT DOCUMENTS 5,387,288 A * 2/1995 Shatas ................... C23C 16/511
                                                       118/665
5,749,966 A * 5/1998 Shates ................... C23C 16/511
                                                        117/79
(Continued)

FOREIGN PATENT DOCUMENTS

JP          2004-186303 A      7/2004
JP          2006-59798 A       3/2006
(Continued)

OTHER PUBLICATIONS

International Search Report dated Jul. 23, 2013 in PCT/JP2013/061407.

*Primary Examiner* — Rakesh K Dhingra
(74) *Attorney, Agent, or Firm* — Rothwell, Figg, Ernst & Manbeck, P.C.

(57) ABSTRACT

Provided is a film forming apparatus including a placement stage; a processing container that defines a processing chamber which accommodates the placement stage and includes a first region and a second region; a gas supply section that supplies a precursor gas to the first region; and a plasma generation section that generates plasma of a reactive gas in the second region. The plasma generation section includes: at least one waveguide that defines a wave guiding path above the placement stage and above the second region, a microwave generator connected to the at least one waveguide, and a plurality of protrusions made of a dielectric material. The protrusions pass through a plurality of openings formed in a lower conductive part of the at least (Continued)

one waveguide to extend into the second region. The protrusions are arranged in a radial direction with respect an axis of the placement stage.

11 Claims, 13 Drawing Sheets

(51) Int. Cl.
H01L 21/306 (2006.01)
C23C 16/511 (2006.01)
C23C 16/455 (2006.01)
H01J 37/32 (2006.01)

(52) U.S. Cl.
CPC .. *C23C 16/45551* (2013.01); *C23C 16/45565* (2013.01); *H01J 37/3244* (2013.01); *H01J 37/32192* (2013.01); *H01J 37/32211* (2013.01); *H01J 37/32229* (2013.01); *H01J 37/32715* (2013.01); *H01J 37/32733* (2013.01); *H01J 37/32834* (2013.01)

(56) References Cited

U.S. PATENT DOCUMENTS

| | | | | |
|---|---|---|---|---|
| 2005/0205016 | A1* | 9/2005 | Sugai | H01J 37/32192 118/723 MA |
| 2006/0157445 | A1* | 7/2006 | Mochiki | H01J 37/3244 216/59 |
| 2009/0065480 | A1* | 3/2009 | Ohmi | H01J 37/32192 216/69 |
| 2010/0055347 | A1* | 3/2010 | Kato | C23C 16/452 427/569 |
| 2011/0088848 | A1* | 4/2011 | Kim | C23C 16/511 156/345.41 |

FOREIGN PATENT DOCUMENTS

| | | |
|---|---|---|
| JP | 2007220638 A * | 8/2007 |
| JP | 2010-157736 A | 7/2010 |
| JP | 2010-239103 A | 10/2010 |
| JP | 2011-222960 A | 11/2011 |
| JP | 4910396 B2 | 4/2012 |
| WO | 2009/119805 A1 | 10/2009 |

* cited by examiner

FILM FORMING APPARATUS

CROSS REFERENCE TO RELATED APPLICATION

This application is a 35 U.S.C. 371 National Phase Entry Application from PCT/JP2013/061407, filed Apr. 17, 2013, which claims priority to Japanese Patent Application No. 2012-164830, filed Jul. 25, 2012, the disclosures of which are incorporated herein in their entirety by reference.

TECHNICAL FIELD

An embodiment of the present invention is related to a film forming apparatus.

BACKGROUND ART

A plasma enhanced atomic layer deposition (PE-ALD) method is known as a kind of method of forming a film on a substrate. In the PE-ALD method, the substrate is exposed to a precursor gas which contains constitutional elements of a thin film desired to form on a substrate so as to allow the precursor gas to be chemically adsorbed on the substrate. Subsequently, the substrate is exposed to a purge gas so as to remove the precursor gas chemically adsorbed excessively on the substrate. Also, the substrate is exposed to plasma of a reactive gas containing the constitutional elements of the desired thin film so as to form a desired thin film on the substrate. In the PE-ALD method, these steps are repeated so as to generate a film formed by processing the atoms or molecules included in the precursor gas, on the substrate.

A single wafer type film forming apparatus and a semi-batch type film forming apparatus are known as apparatuses for performing the PE-ALD method. Among these film forming apparatuses, the semi-batch type film forming apparatus is excellent in throughput compared to the single wafer type film forming apparatus since the semi-batch type film forming apparatus is capable of forming a film on a plurality of substrates simultaneously. Specifically, in the semi-batch type film forming apparatus, a region in which a precursor gas is supplied and a region in which plasma of a reactive gas is generated are separately provided in a processing chamber and a plurality of substrates are moved to sequentially pass through these regions. As described above, since the semi-batch type film forming apparatus is capable of performing the supply of the precursor gas and the generation of the plasma of the reactive gas in different regions simultaneously, the semi-batch type film forming apparatus has an advantage in that its throughput is high compared to that of the single wafer type film forming apparatus.

Patent Document 1 and Patent Document 2 below disclose semi-batch type film forming apparatuses. The film forming apparatus described in Patent Document 1 is provided with a susceptor unit and a gas injection unit. The susceptor unit is used for supporting a substrate and is configured to rotate around a rotation axis. The gas injection unit is disposed to face the susceptor unit and includes a first region in which a precursor gas is supplied, a purge region in which a purge gas is supplied, a second region in which a reactive gas is supplied, and another purge region in which the purge gas is supplied. The first region, the purge region, the second region, and the another purge region are arranged in a circumferential direction and exhaust lines extending in a radial direction are provided between respective regions.

The film forming apparatus described in Patent Document 2 is provided with a rotating tray, a shower head, and a plasma source. The rotating tray is used for supporting the substrate and is rotatable around the rotation axis. The shower head and the plasma source are disposed to face the rotating tray and arranged in a circumferential direction. The shower head has a planar shape which is substantially a fan shape and supplies the precursor gas. The plasma source also has substantially a fan shape in a plan view, and supplies a high frequency power from a comb-shaped electrode while the reactive gas is supplied to generate plasma of the reactive gas. Exhaust holes are formed around the circumferences of the shower head and the plasma source, and a shower plate is provided between the shower head and the plasma source to supply the purge gas.

PRIOR ART DOCUMENT

Patent Document

Patent Document 1: Japanese Patent Laid-Open Publication No. 2010-157736
Patent Document 2: Japanese Patent Laid-Open Publication No: 2011-222960

SUMMARY OF INVENTION

Problems to be Solved by the Invention

Microwaves capable of generating high-density plasma having a low electron temperature have been attracting attention as a plasma excitation source of plasma in recent years. In general, a film forming apparatus using microwaves as the plasma excitation source employs a configuration in which a dielectric window is provided above a processing chamber and a waveguide is provided above the dielectric window.

In the semi-batch type film forming apparatus, since the substrate is rotated around a rotation axis, it is needed to generate plasma in a region which extends in the radial direction in relation to the rotation axis. However, in the above-described configuration of the film forming apparatus using the microwaves as the plasma excitation source, a plasma-generation position is localized to a portion of the entire region below the dielectric window and the localized plasma-generation position may be hard to control, as the pressure inside the processing container increases.

Accordingly, what is requested in the present technical field is to improve controllability of a plasma-generation position in a semi-batch type film forming apparatus that supplies microwaves to excite plasma within a processing container.

Means to Solve the Problems

A film forming apparatus according to one aspect of the present invention includes a placement stage, a processing container, a gas supply section, and a plasma generation section. The placement stage includes a plurality of substrate placing regions and is provided to be rotatable around an axis such that the plurality of substrate placing regions are moved in a circumferential direction. The processing container is configured to define a processing chamber which accommodates the placement stage. The processing chamber includes a first region and a second region. The substrate placing regions sequentially passes through the first region and the second region while moving in the circumferential direction with respect to the axis by rotation of the placement stage. The gas supply section is configured to supply a precursor gas to the first region from an injection part provided to face the placement stage. The plasma generation section is configured to generate plasma of a reactive gas in the second region. The plasma generation section includes: at least one waveguide configured to define a wave guiding path above the placement stage and above the second region, a microwave generator connected to the at least one waveguide, and a plurality of protrusions made of a dielectric material and configured to pass through a plurality of openings formed in a lower conductive part of the at least one waveguide to extend into the second region. The plurality of protrusions are arranged in a radial direction with respect to the axis.

In the film forming apparatus, microwaves propagated in the wave guiding path and leaking out from the waveguide are concentrated on the plurality of protrusions extending from the openings of the lower conductive part of the waveguide to the second region. Accordingly, the plasma-generation positions are concentrated in the vicinity of the plurality of protrusions. Therefore, the film forming apparatus is excellent in controllability of a plasma-generation position. Further, the plurality of protrusions are arranged in the radial direction with respect to the axis which is the center of rotation of the placement stage. Accordingly, the film forming apparatus is capable of generating plasma in the region extending in the radial direction with respect to the axis in the film forming apparatus.

In an embodiment, the film forming apparatus may further include a plurality of plungers provided to face waveguide side ends of the plurality of protrusions through the waveguide and each of the plurality of plungers may include a reflection plate capable of adjusting a distance from the waveguide. According to the present embodiment, a position of the reflection plate of the plunger may be adjusted such that the peak positions of stationary waves within the wave guiding path of the waveguide may be relatively adjusted with respect to positions of the plurality of openings of the waveguide. Accordingly, since the power of microwaves leaking out to the plurality of protrusions arranged in the radial direction may be relatively adjusted, it becomes possible to adjust a plasma density distribution in the radial direction with respect to the axis. Here, in the semi-batch type film forming apparatus, a circumferential speed of a substrate region which is far from the axis is fast compared to that of another substrate region which is near to the axis. Accordingly, when the positions of the reflection plates of the plungers are adjusted such that strength of the microwaves is gradually increased as the distance from the axis increases, a plasma processing on the substrate can be uniformized.

In an embodiment, the plurality of protrusions may be formed in a rod shape. In another embodiment, the plurality of protrusions may have an arc shape in a cross section orthogonal to the axis. Further, in an embodiment, the plurality of protrusions may be also arranged along a plurality of concentric circles around the axis. According to the embodiment, the plasma-generation region may be expanded in the circumferential direction with respect to the axis.

In an embodiment, the at least one waveguide may include a plurality of waveguides extending along a plurality of concentric circles parallel to each of the plurality of concentric circles. Further, in another embodiment, one or more waveguides may extend in the radial direction with respect to the axis.

In an embodiment, the injection part may include a plurality of gas shower portions each of which provides one or more injection ports in the regions having different distances from the axis. The gas supply section may be configured to individually adjust flow rates of the precursor gas injected from the plurality of gas shower portions. According to the embodiment, the precursor gas may be supplied in different flow rates from the regions to which the distances from the axis are different. As described above, in the semi-batch type film forming apparatus, a circumferential speed of a substrate region which is far from the axis is fast compared to that of another substrate region which is near to the axis. Accordingly, when the flow rate of the precursor gas injected from the region which is far from the axis is long is made to be high compared to that of another substrate region which is near to the axis is short, the entire surface of the substrate is capable of being exposed to the precursor gas relatively uniformly.

Effect of the Invention

As described above, according to an aspect and an embodiment of the present invention, a film forming apparatus which is excellent in controllability of a plasma-generation position is provided as a semi-batch type film forming apparatus which supplies microwaves to excite plasma within a processing container.

DETAILED DESCRIPTION

Figure 1:
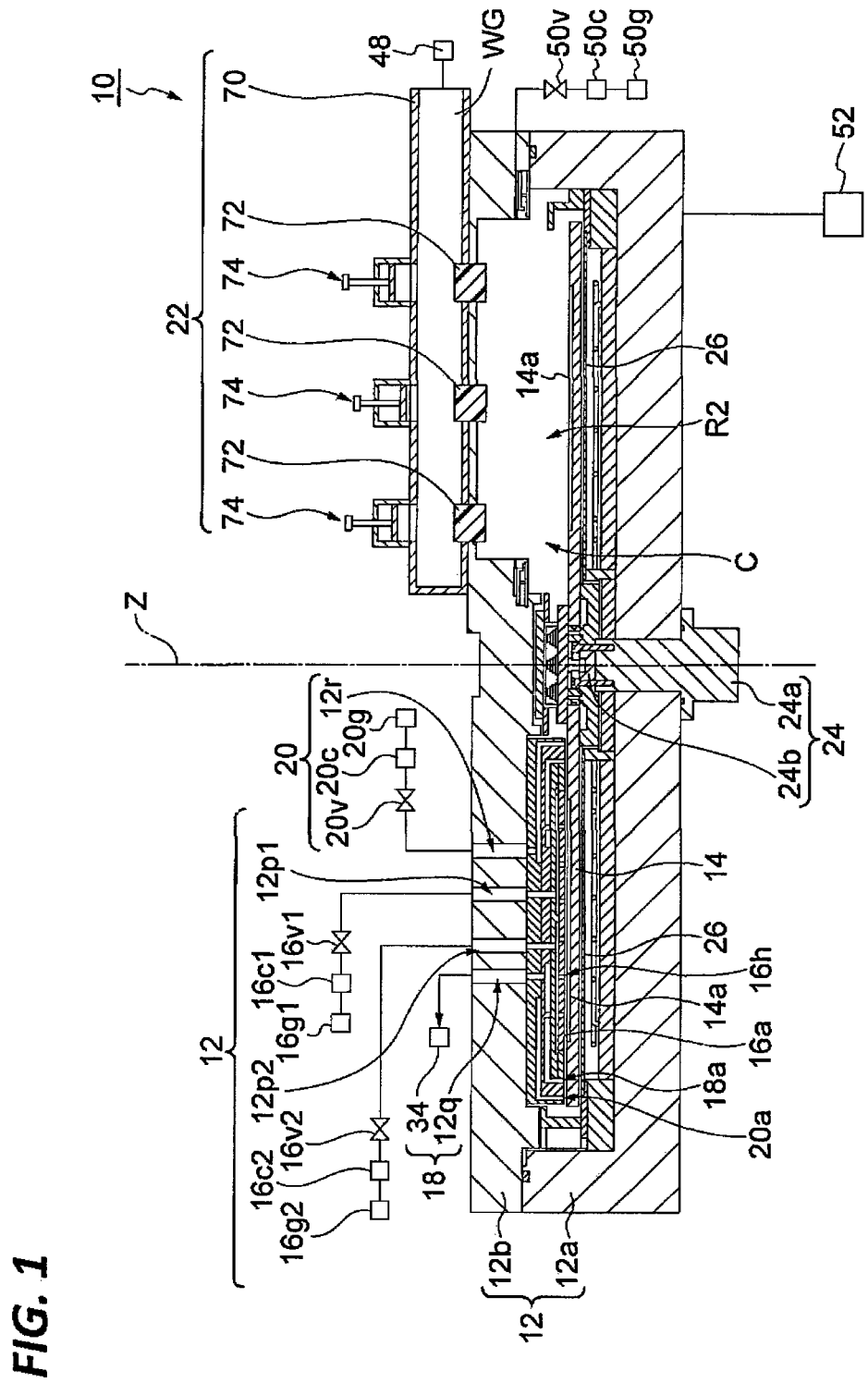
FIG. 1 is a cross-sectional view schematically illustrating a film forming apparatus according to an embodiment.

Hereinafter, descriptions will be made on various embodiments with reference to the accompanying drawings. Further, the same reference numerals will be assigned to the same or corresponding portions in respective drawings.

Figure 2:
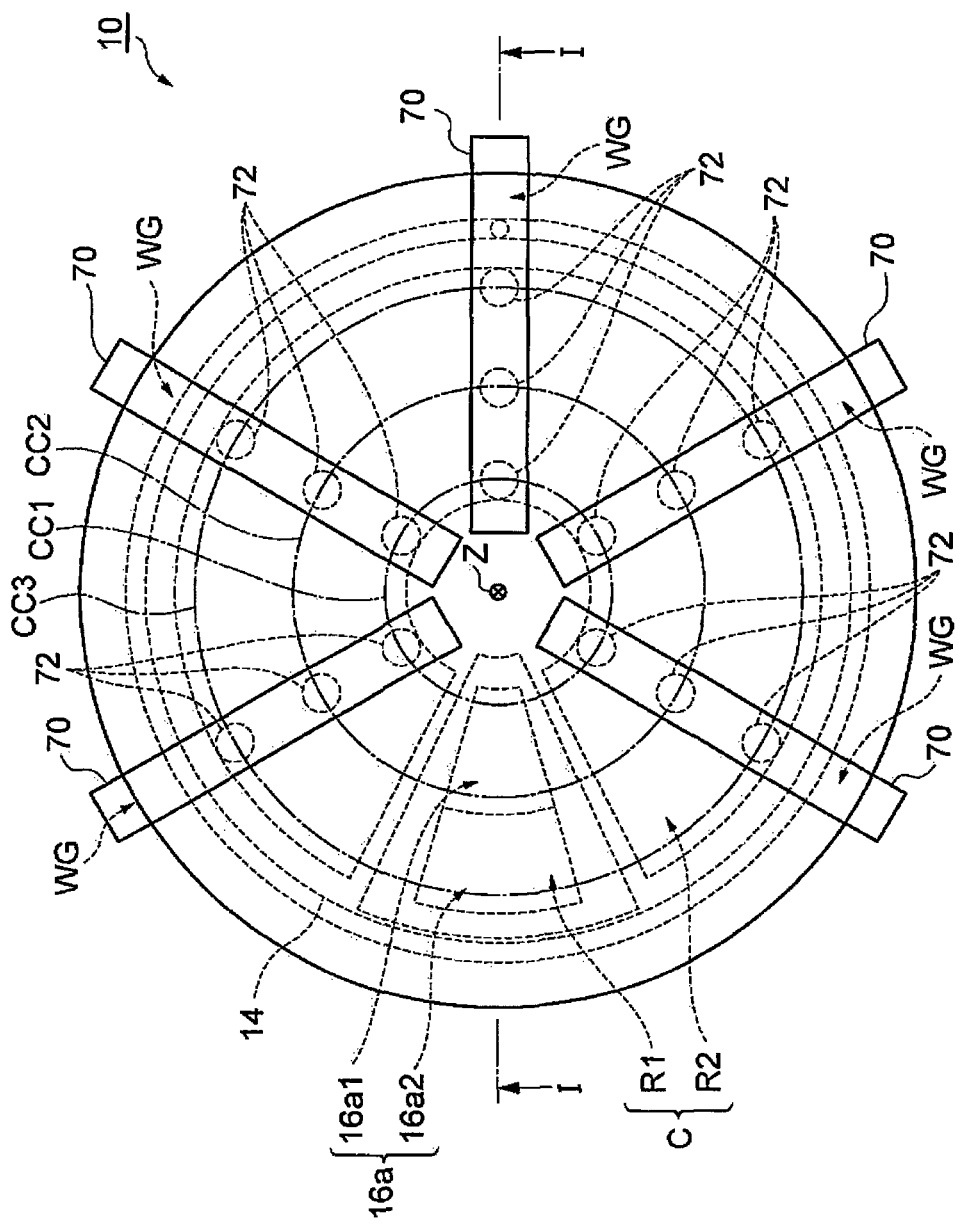
FIG. 2 is a top view schematically illustrating the film forming apparatus according to the embodiment.
Figure 3:
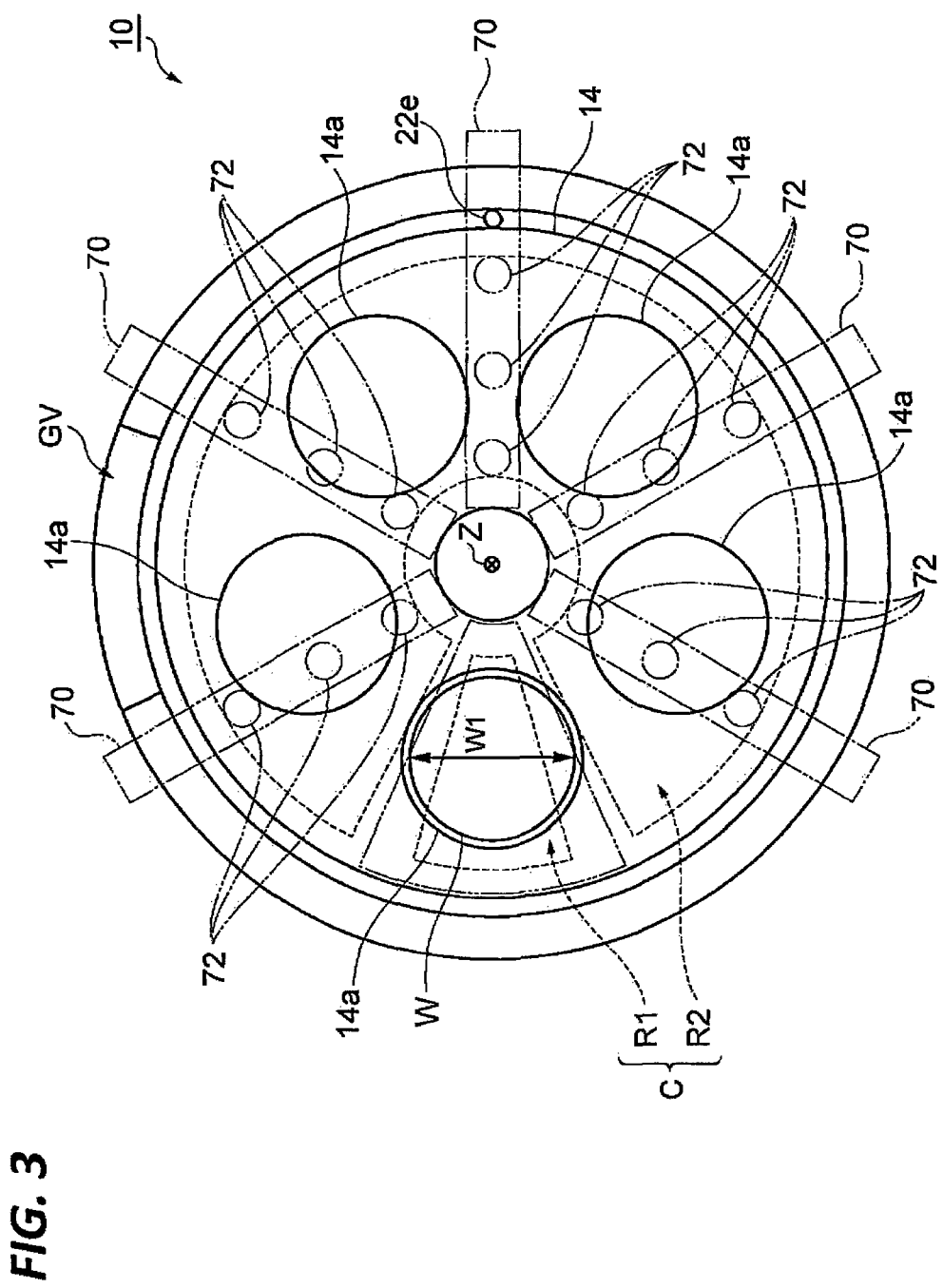
FIG. 3 is a plan view illustrating the film forming apparatus illustrated in FIG. 2 in a state where an upper part of a processing container is removed from the film forming apparatus.

FIG. 1 is a cross-sectional view illustrating a film forming apparatus according to an embodiment. FIG. 2 is a top view schematically illustrating the film forming apparatus according to the embodiment. FIG. 1 illustrates a cross section taken along line I-I of FIG. 2. FIG. 3 is a plan view illustrating the film forming apparatus illustrated in FIG. 2 in a state where an upper part of a processing container is removed from the film forming apparatus. A film forming apparatus 10 illustrated in FIGS. 1, 2 and 3 includes a processing container 12, a placement stage 14, a gas supply section 16 which supplies a precursor gas, an exhaust section 18, a gas supply section 20 which supplies a purge gas, and a plasma generation section 22.

The processing container 12 is a substantially cylindrical container extending in the axis Z direction. The processing container 12 defines a processing chamber C therein. The processing container 12 may include an inner surface which be made of a metal such as, for example, aluminum subjected to, for example, a plasma resistance treatment (e.g., alumite treatment or $Y_2O_3$ thermal spraying treatment). In an embodiment, the processing container 12 includes a lower part 12a and an upper part 12b as illustrated in FIG. 1. The lower part 12a has a cylindrical shape opened upwardly and includes a sidewall and a bottom wall defining a processing chamber C. The upper part 12b is a cover which defines the processing chamber C from the upper side. The upper part 12b is attached to the top portion of the lower part 12a to close the upper opening of the lower part 12a. A sealing member may be provided between the lower part 12a and the upper part 12b to seal the processing chamber C.

A placement stage 14 is provided within the processing chamber C defined by the processing container 12. The placement stage 14 has a substantially disk shape. The placement stage 14 is configured to be rotatable around the axis Z. In an embodiment, the placement stage 14 is rotated around the axis Z by a driving mechanism 24. The driving mechanism 24 includes a driving device 24a such as, for example, a motor and a rotating shaft 24b, and is attached to the lower part 12a of the processing container 12. The rotating shaft 24b extends into the processing chamber C taking the axis Z as the central axis thereof and rotates around the axis Z by a driving force from the driving device 24a. A central portion of the placement stage 14 is support on the rotating shaft 24b. With this configuration, the placement stage 14 may rotate around the axis Z. Further, a sealing member such as, for example, an O-ring may be provided between the lower part 12a of the processing container 12 and the driving mechanism 24 to seal the processing chamber C.

As illustrated in FIGS. 1 and 3, at least one substrate placing region 14a is provided on the top surface of the placement stage 14. In an embodiment, a plurality of substrate placing regions 14a are arranged in the circumferential direction with respect to the axis Z. The substrate placing region 14a is configured as a recess having a diameter which is substantially the same as or slightly larger than a diameter of a substrate W placed therein. In the processing chamber C, a heater 26 is provide below the placement stage 14 to heat the substrate W placed in the substrate placing region 14a. The substrate W is conveyed into the processing chamber C by a conveyance apparatus such as, for example, a robot arm, through a gate valve GV provided in the processing container 12 and is placed in the substrate placing region 14a. Further, after having been processed by the film forming apparatus 10, the substrate W is taken out by the conveyance apparatus from the processing chamber C through the gate valve GV. The processing chamber C includes a first region R1 and a second region R2 arranged in the circumferential direction with respect to the axis Z. The substrate W placed in the substrate placing region 14 passes through the first region R1 and the second region R2 sequentially according to the rotation of the placement stage 14.

Figure 4:
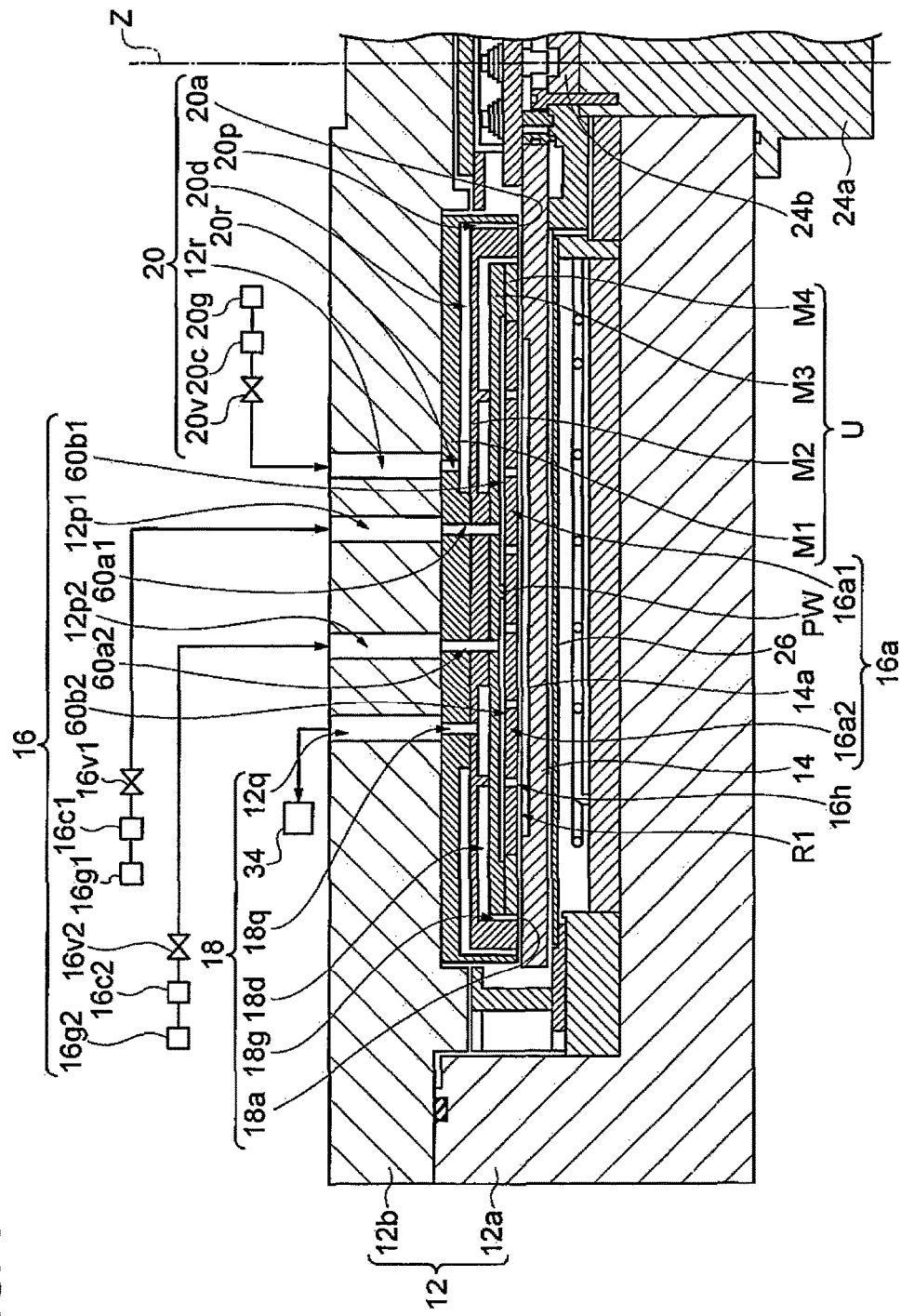
FIG. 4 is an enlarged sectional view illustrating the film forming apparatus illustrated in FIG. 1, in which cross-sections of a as supply section 16, an exhaust section 18 and a gas supply section 20 are illustrated in an enlarged scale.
Figure 5:
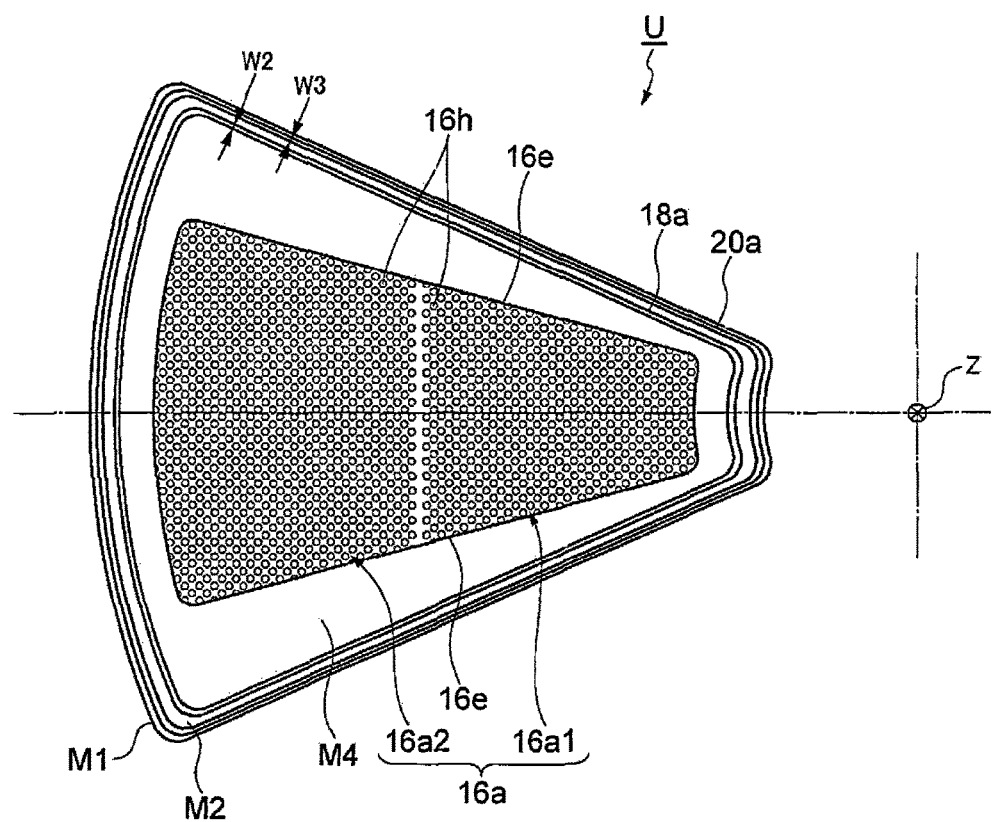
FIG. 5 is a plan view illustrating an injection part of the gas supply section 16, an exhaust port of the exhaust section 18 and an injection port of the gas supply section 20 of the film forming apparatus illustrated in FIG. 1.

Hereinafter, FIGS. 4 and 5 will be referenced in addition to FIGS. 2 and 3. FIG. 4 is an enlarged sectional view of the film forming apparatus illustrated in FIG. 1, in which cross sections of a gas supply section 16, an exhaust section 18 and a gas supply section 20 are illustrated in an enlarged scale. FIG. 5 is a plan view illustrating an injection part of the gas supply section 16, an exhaust port of the exhaust section 18 and an injection port of the gas supply section 20 of the film forming apparatus illustrated in FIG. 1 which are viewed from the bottom side. As illustrated in FIGS. 2 to 4, above the first region R1, the injection part 16a of the gas supply section 16 is provided to face the top surface of the placement stage 14. In other words, among the regions included in the processing chamber C, a region disposed to face the injection part 16 corresponds to a first region R1.

As illustrated in FIGS. 4 and 5, a plurality of injection ports 16h are formed in the injection part 16a. The gas supply section 16 supplies a precursor gas from the plurality of injection ports 16h to the first region R1. The precursor gas is supplied to the first region R1 to be chemically adsorbed onto the surface of the substrate W which passes through the first region R1. An example of the precursor gas is DCS (dichlorosilane).

In an embodiment, as illustrated in FIG. 5, two edges 16e which define the injection part 16a in the circumferential direction are included in the edges defining the injection part 16a. These two edges 16e extend to come closer to each other as two edges 16e approach to the axis Z. The two edges 16e may extend in the radial direction with respect to, for example, the axis Z. That is, the injection part 16a is provided in a region having a fan shape in a plan view. The plurality of the injection ports 16h are formed between these two edges 16e. Here, the speed at each position within the substrate W according to the rotation of the placement stage 14e varies depending on the distance from the axis Z. That is, the speed at each position within the substrate W becomes faster as the farther the position is spaced away from the axis Z. In the embodiment, the injection part 16a is configured such that a position on the substrate W to face more injection ports 16h as the farther the position on the substrate W is spaced away from the axis Z. Accordingly, variation in time for exposing each position of the substrate W to the precursor gas may be reduced.

Further, in an embodiment, the injection part 16a includes a plurality of gas shower portions. The gas shower portions are provided in regions located at positions to which distances from the axis Z are different. In the embodiment illustrated in FIGS. 2, 4 and 5, the injection part 16a includes two gas shower portions 16a1 and 16a2 and the gas shower portion 16a1 is provided in the region nearer to the axis Z than the gas shower portion 16a2. That is, the injection part 16a provides one of the gas shower portions 16a1 and 16a2 in each of two regions divided by the distance from the axis Z. The gas supply section 16 is configured to individually adjust the flow rates of the precursor gas injected from the gas shower portions 16a1 and 16a2, as will be described below.

As illustrated in FIGS. 4 and 5, an exhaust port 18a is formed around the circumference of the injection part 16a and the exhaust section 18 exhausts the first region R1 from the exhaust port 18a. The exhaust port 18a of the exhaust section 18 is disposed to face the top surface of the placement stage 14 and extends along a closed path surrounding the outer periphery of the injection part 16a, as illustrated in FIG. 5. As described above, the exhaust port 18a having a narrow width surrounds the circumference of the injection part 16a in the film forming apparatus 10.

Further, as illustrated in FIGS. 4 and 5, the injection port 20a of the gas supply section 20 is formed around the circumference of the exhaust port 18a and the gas supply section 20 injects the purge gas from the injection port 20a. The injection port 20a of the gas supply section 20 is disposed to face the top surface of the placement stage 14 and extends along the closed path surrounding the outer periphery of the exhaust port 18a. An inert gas such as, for example, $N_2$ gas, may be used as the purge gas supplied from the gas supply section 20. When the purge gas is sprayed onto the substrate W, the precursor gas chemically adsorbed on the substrate W excessively is removed from the substrate W.

In the film forming apparatus 10, due to the exhaust from the exhaust port 18a and the injection of the purge gas from the injection port 20a, the precursor gas supplied to the first region R1 is suppressed from leaking out of the first region R1 and the reactive gas or radical supplied to the second region R2 is suppressed from infiltrating into the first region R1 as will be described below. That is, the exhaust section 18 and the gas supply section 20 separate the first region R1 and the second region R2. Further, since the injection port 20a and the exhaust port 18a have substantially a belt shape in a plan view, extending along the closed path which surrounds the outer periphery of the injection part 16a, each of the widths of the injection port 20a and the exhaust port 18a is narrow. Accordingly, the separation of the first region R1 and the second region R2 is implemented while securing an angular range in which the second region R2 extends in the circumferential direction with respect to the axis Z. In an embodiment, the width W2 of the exhaust port 18a and the width W3 of the injection port 20a extending between the first region R1 and the second region R2 (see FIG. 5) are made smaller than the diameter W1 of the substrate placing region 14a (see FIG. 3).

Figure 6:
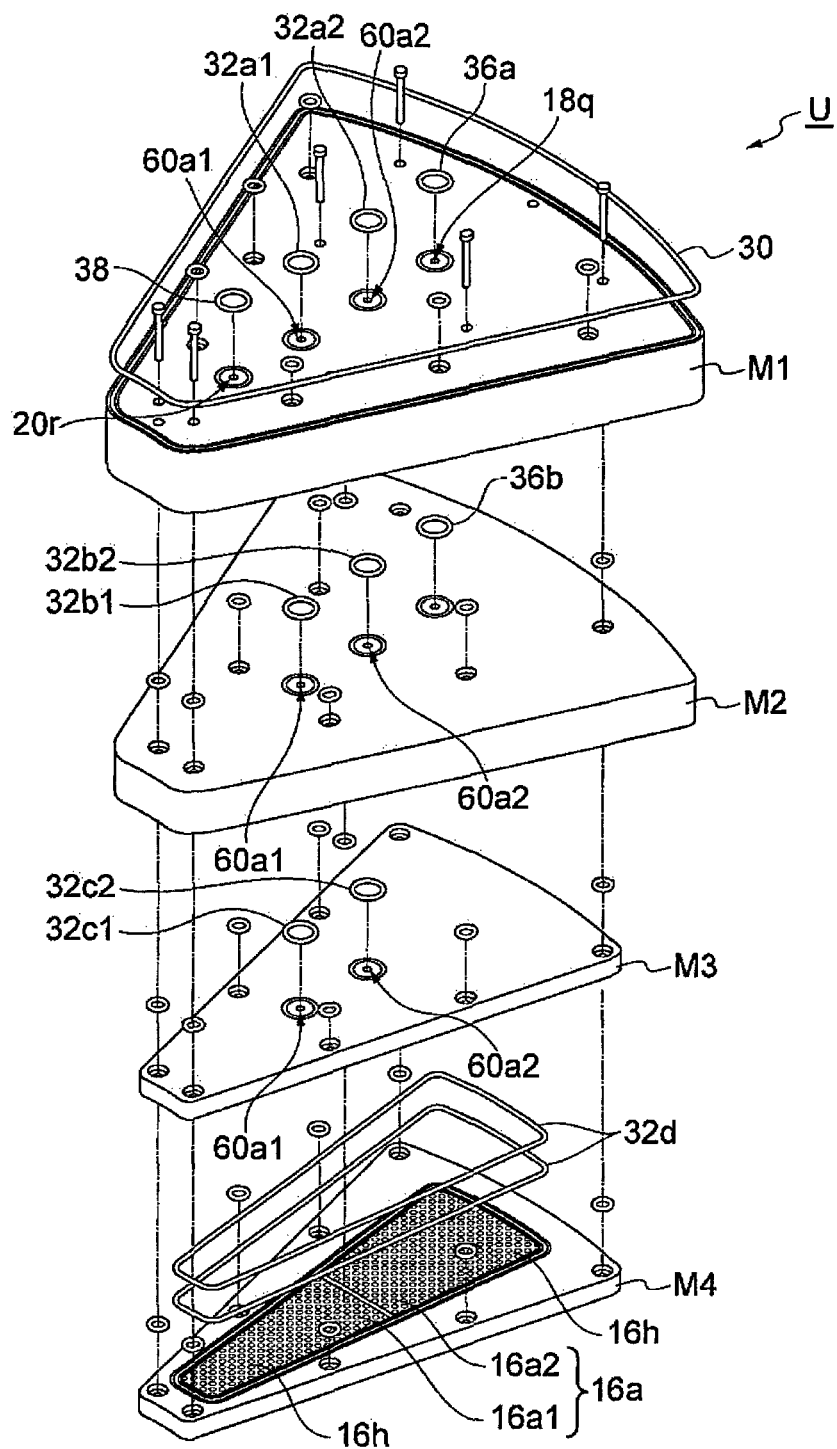
FIG. 6 is an exploded perspective view illustrating a unit, which defines the injection part of the gas supply section 16, the exhaust port of the exhaust section 18 and the injection port of the gas supply section 20, according to the embodiment.
Figure 7:
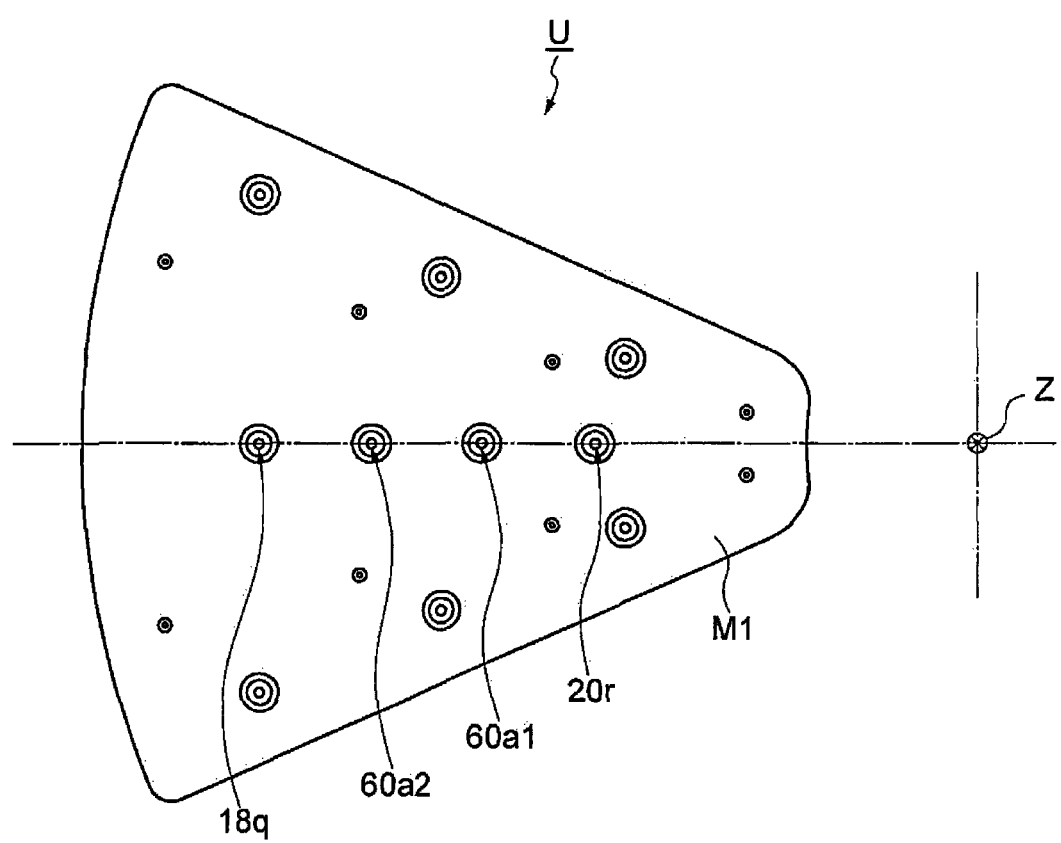
FIG. 7 is a plan view of the unit illustrated in FIG. 6 seen from the top side.

In an embodiment, the film forming apparatus 10 may be provided with a unit U which defines the injection part 16a, the exhaust port 18a and the injection port 20a. The unit U is configured such that the flow rates of the precursor gas from the gas shower portions 16a1 and 16a2 may be individually adjusted. Hereinafter, FIGS. 6 and FIG. 7 are also referenced. FIG. 6 is an exploded perspective view of a unit which defines the injection part of the gas supply section 16, an exhaust port of the exhaust section 18, and an injection port of the gas supply section 20. FIG. 7 is a plan view of the unit illustrated in FIG. 6 viewed from the top side. Further, the top surface of the unit U is illustrated in FIG. 7 and the bottom surface of the unit U is illustrated in FIG. 5.

As illustrated in FIGS. 4 to 7, the unit U is constituted by a first member M1, a second member M2, a third member M3 and a fourth member M4, and has a structure in which the first to fourth members M1 to M4 are stacked in this order. The unit U is attached to the processing container 12 to be in contact with the bottom surface of the upper part 12b of the processing container 12, and a sealing member 30 is provided between the bottom surface of the upper part 12b of the processing container 12 and the first member M1. The sealing member 30 extends along the outer edge of the top surface of the first member M1.

The first to fourth members M1 to M4 have substantially a fan shape in a plan view. The first member M1 defines a recess in the lower part thereof in which the second to fourth members M2 to M4 are accommodated. Further, the second member M2 defines a recess in the lower part thereof in which the third and the fourth members M3 and M4 are accommodated. The third member M3 and the fourth member M4 have substantially the same plane size.

A gas supply line 60a1 which penetrates the first to the third members M1 to M3 is formed in the unit U. The upper end of the gas supply line 60a1 is connected with a gas supply line 12p1 provided in the upper part 12b of the processing container 12. The gas supply line 12p1 is connected with a gas source 16g1 of the precursor gas through a valve 16v1 and a flow rate controller 16c1 such as, for example, a mass flow controller. Further, the lower end of the gas supply line 60a1 is connected with a buffer chamber 60b1 formed between the third member M3 and the fourth member M4. The buffer chamber 60b1 is connected with the plurality of injection ports 16h of the gas shower portion 16a1 provided in the fourth member M4.

Further, a gas supply line 60a2 which penetrates the first to third members M1 to M3 is formed in the unit U. The upper end of the gas supply line 60a2 is connected with a gas supply line 12p2 provided in the upper part 12b of the processing container 12. The gas supply line 12p2 is connected with a gas source 16g2 of the precursor gas through a valve 16v2 and a flow rate controller 16c2 such as, for example, a mass flow controller. Further, the lower end of the gas supply line 60a2 is connected with a buffer chamber 60b2 formed between the third member M3 and the fourth member M4. The buffer chamber 60b2 is separated from the buffer chamber 60b1 by a partitioning wall PW provided between the buffer chamber 60b2 and the buffer chamber 60b1. The buffer chamber 60b2 is connected with the plurality of injection ports 16h of the gas shower portion 16a2 provided in the fourth member M4.

A sealing member 32a1 such as, for example, an O-ring, is provided between the upper part 12b of the processing container 12 and the first member M1 to surround a connection portion of the gas supply line 12p1 and the gas supply line 60a1. With the sealing member 32a1, the precursor gas supplied to the gas supply line 12p1 and the gas supply line 60a1 may be prevented from leaking out from the boundary between the upper part 12b of the processing container 12 and the first member M1. Further, the sealing members 32b1 and 32c1 such as, for example, O-rings, are provided between the first member M1 and the second member M2 and between the second member M2 and the third member M3, respectively, to surround the gas supply line 60a1. With the sealing members 32b1 and 32c1, the precursor gas supplied to the gas supply line 60a1 may be prevented from leaking out from the boundary between the first member M1 and the second member M2 and the boundary between the second member M2 and the third member M3.

Similarly, a sealing member 32a2 is provided between the upper part 12b of the processing container 12 and the first member M1 to surround a connection portion of the gas supply line 12p2 and the gas supply line 60a2. With the sealing member 32a2, the precursor gas supplied to the gas supply line 12p2 and the gas supply line 60a2 may be prevented from leaking out from the boundary between the upper part 12b of the processing container 12 and the first member M1. Further, the sealing members 32b2 and 32c2 are provided between the first member M1 and the second member M2 and between the second member M2 and the third member M3, respectively, to surround the gas supply line 60a2. With the sealing members 32b2 and 32c2, the precursor gas supplied to the gas supply line 60a2 may be prevented from leaking out from the boundary between the first member M1 and the second member M2 and the boundary between the second member M2 and the third member M3.

Further, a sealing member 32d is provided between the third member M3 and the fourth member M4 to surround the buffer chambers 60b1 and 60b2. With the sealing members 32d, the precursor gas supplied to the buffer chambers 60b1 and 60b2 may be prevented from leaking out from the boundary between the third member M3 and the fourth member M4.

As described above, the gas supply line for supplying the precursor gas to the gas shower portion 16a1 and the gas supply line for supplying the precursor gas to the gas shower portion 16a2 are separated from each other in the unit U. Further, the gas supply section 16 includes a flow rate controller 16c1 for the gas shower portion 16a1 and a flow rate controller 16c2 for the gas shower portion 16a2. Accordingly, the gas supply section 16 is capable of individually adjusting the flow rates of the precursor gas injected from the gas shower portion 16a1 and the gas shower portion 16a2. Accordingly, the flow rate of the precursor gas from the gas shower portion 16a2 may be set to be higher than the flow rate of the precursor gas from the gas shower portion 16a1 such that a position on the substrate W is exposed to more precursor gas as the farther the position is spaced away from the axis Z. Further, a line for supplying the precursor gas to the gas shower portion 16a1 and a line for supplying the precursor gas to the gas shower portion 16a2 may be connected to a common gas source through a flow splitter. In this case, a distribution ratio of the precursor gas supplied to the gas shower portion 16a1 and the gas shower portion 16a2 may be adjusted by the flow splitter.

Further, an exhaust line 18q which penetrates the first and second members M1 to M2 is formed in the unit U. The upper end of the exhaust line 18q is connected with an exhaust line 12q provided in the upper part 12b of the processing container 12. The exhaust line 12q is connected with an exhaust device 34 such as, for example, a vacuum pump. Further, the lower end of the exhaust line 18q is connected with a space 18d provided between the bottom surface of the second member M2 and the top surface of the third member M3. Further, as described above, the second member M2 defines a recess in which the third and the fourth members M3 and M4 are accommodated, and a gap 18g is formed between an inner surface of the second member M2 and side end surfaces of the third member M3 and the fourth member M4 which define the recess. The space 18d is connected with the gap 18g and the lower end of the gap 18g functions as the exhaust port 18a described above.

Further, the sealing member 36a such as, for example, an O-ring, is provided between the upper part 12b of the processing container 12 and the first member M1 to surround a connection portion of the exhaust line 18q and the exhaust line 12q. With the sealing member 36a, the exhaust gas passing through the exhaust line 18q and the exhaust line 12q may be prevented from leaking out from the boundary between the upper part 12b of the processing container 12 and the first member M1. Further, the sealing member 36b such as, for example, an O-ring, is provided between the first member M1 and the second member M2 to surround the exhaust line 18q. With the sealing member 36b, the gas passing through the exhaust line 18q may be prevented from leaking out from the boundary between the first member M1 and the second member M2.

Further, a gas supply line 20r which penetrates the first member M1 is formed in the unit U. The upper end of the gas supply line 20r is connected with a gas supply line 124 provided in the upper part 12b of the processing container 12. The gas supply line 124 is connected with a gas source 20g of the purge gas through a valve 20v and a flow rate controller 20c such as, for example, a mass flow controller. Further, the lower end of the gas supply line 20r is connected with a space 20d provided between the bottom surface of the second member M1 and the top surface of the second member M2. Further, as described above, the first member M1 defines a recess in which the second to fourth members M2 to M4 are accommodated, and a gap 20p is formed between an inner surface of the first member M1 and side surfaces of the second member M2, and the inner surface and side surfaces define the recess. The space 20d is connected with the gap 20p. Further, the lower end of the gap 20p functions as an injection port 20a of the gas supply section 20.

A sealing member 38 such as, for example, an O-ring is provided between the upper part 12b of the processing container 12 and the first member M1 so as to surround a connection portion of the gas supply line 12r and the gas supply line 20r. With the sealing member 38, the purge gas passing through the gas supply line 12r and the gas supply line 20r may be prevented from leaking out from the boundary between the upper part 12b of the processing container 12 and the first member M1.

Figure 8:
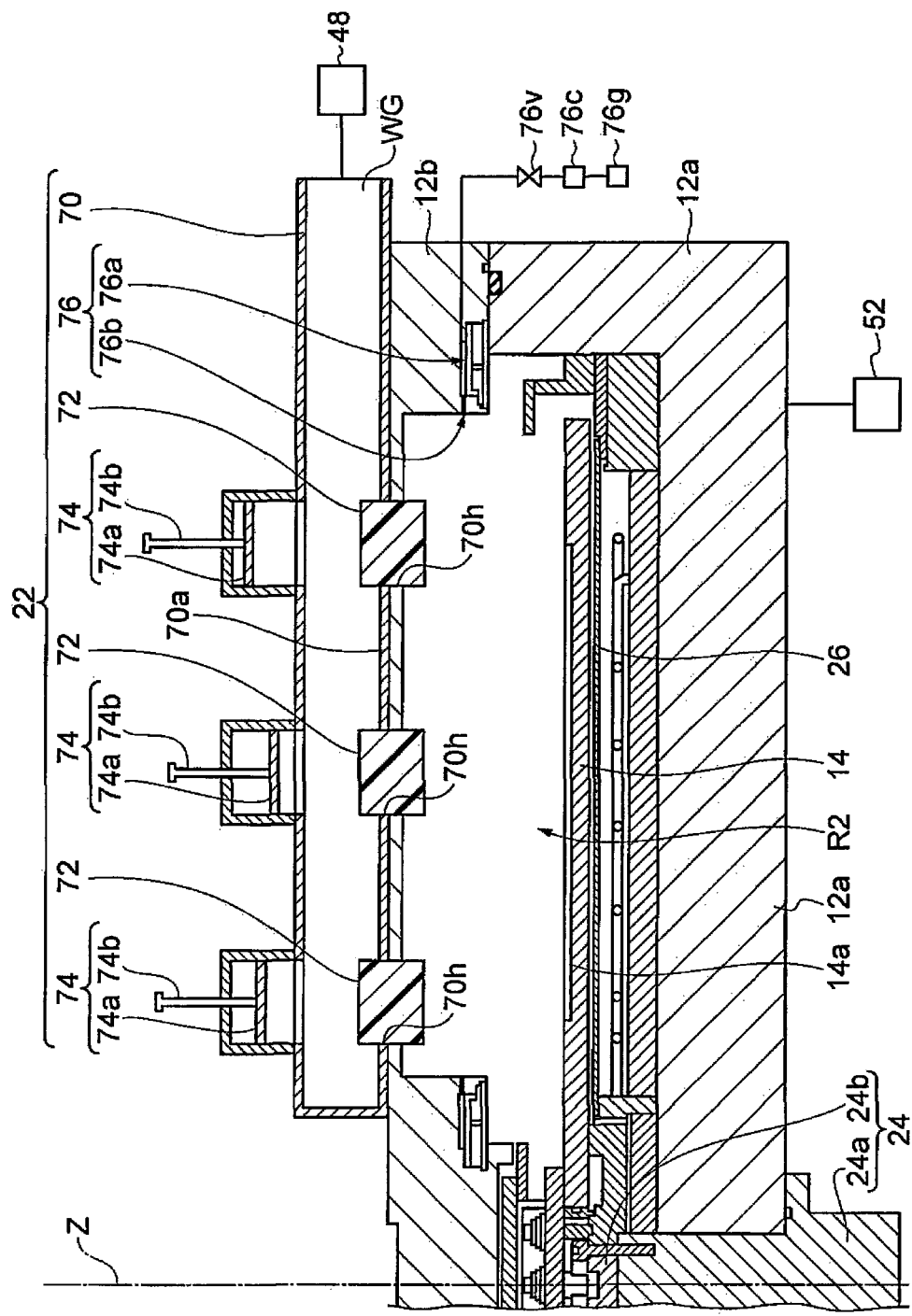
FIG. 8 is an enlarged sectional view of the film forming apparatus illustrated in FIG. 1, in which a cross section of a plasma generation section is illustrated in an enlarged scale.

Hereinafter, FIGS. 1 to 3 are referenced again and FIG. 8 is also referenced. FIG. 8 is an enlarged sectional view of the film forming apparatus illustrated in FIG. 1, in which a cross section of the plasma generation section is illustrated in an enlarged scale. As illustrated in FIGS. 1 to 3 and FIG. 8, the film forming apparatus 10 is provided with the plasma generation section 22. The plasma generation section 22 supplies a reactive gas to the second region R2 and supplies microwaves to the second region R2, thereby generating plasma of the reactive gas in the second region R2. In an embodiment, the precursor gas chemically adsorbed onto the substrate W may be nitrified in the second region R2. When a film deposited on the substrate W is nitrified, for example, $N_2$ gas or $NH_3$ gas may be used as the reactive gas.

The plasma generation section 22 may include one or more waveguides 70 configured to supply microwaves to the second region R2. In the embodiment illustrated in FIG. 1 to FIG. 3, the plasma generation section 22 includes five waveguides 70 extending in the radial direction with respect to the axis Z. The waveguides 70 are rectangular waveguides, and are mounted on the upper part 12b of the processing container 12 to define wave guiding paths WG which extend in the radial direction with respect to the axis Z. Further, the waveguides 70 are arranged in the circumferential direction with respect to the axis Z. A microwave generator 48 is connected with respective waveguides 70. The microwave generator 48 generates microwaves having a frequency of, for example, about 2.45 GHz and supplies the microwaves to the waveguide 70.

Each waveguide 70 includes a lower conductive part 70A which defines a wave guiding path WG from below. The lower conductive part 70A contacts the top surface of the upper part 12b of the processing container 12. A plurality of openings 70h which penetrate the lower conductive part 70A and the upper part 12b of the processing container in the axis Z direction are formed in the lower conductive part 70A and the upper part 12b of the processing container 12. The plurality of openings 70h are arranged in the radial direction with respect to the axis Z. Further, in an embodiment, these openings are arranged along a plurality of concentric circles (denoted by reference symbols CC1, CC2 and CC3 in figures) around the axis Z. A plurality of protrusions 72 made of dielectric materials pass through the plurality of openings 70h.

The plurality of protrusions 72 may be made of, for example, quartz. In the present embodiment, each of the plurality of protrusions 72 has a rod shape extending in the axis Z direction, that is, a circular columnar shape. One end of each of the plurality of protrusions 72 is located within the corresponding wave guiding path WG and the other end is protruded into the second region R2. As described above, since the plurality of openings 70h are arranged in the radial direction with respect to the axis Z, the plurality of protrusions 72 passing through the openings 70h are aligned with respect to the axis Z. Further, in an embodiment, as illustrated in FIGS. 2 and 3, the plurality of protrusions 72 passing through the openings 70h formed in the plurality of waveguides 70 are arranged along the plurality of concentric circles (denoted by reference symbols CC1, CC2 and CC3 in the figures) around the axis Z.

In an embodiment, the plasma generation section 22 includes a plurality of plungers 74. The plungers 74 are omitted in FIG. 2. Each plunger 74 includes a reflection plate 74a and a position adjustment mechanism 74b. The plurality of plungers 74 are provided to face the upper ends of the plurality of protrusions 72. Specifically, each of the plurality of plungers 74 is attached such that the reflection plate 74a is opposed to one of the upper ends of the plurality of protrusions 72 through the waveguide 70. The position adjustment mechanism 74b of each plunger 74 has a function of adjusting a distance of the reflection plate 74a from the wave guiding path WG in the axis Z direction.

Further, the plasma generation section 22 includes a gas supply section 76. The gas supply section 76 supplies a reactive gas to the second region R2. When the precursor gas containing Si chemically adsorbed on the substrate W is nitrified as described above, the reactive gas may be, for example, $N_2$ gas or $NH_3$ gas. In an embodiment, the gas supply section 76 may include a gas supply line 76a and an injection port 76b. The gas supply line 50a is formed in the upper part 12b of the processing container 12 to surround the second region R2, for example, in a plane intersecting with the axis Z. Further, the injection port 76b connected to the gas supply line 76a is formed in the upper part 12b of the processing container 12. In an embodiment, a plurality of injection ports 76b may be formed in the upper part 12b. Further, a gas source 76g of the reactive gas is connected to the gas supply line 76a through a valve 76v and a flow rate controller 76c such as, for example, a mass flow controller. Further, as illustrated in FIG. 3, an exhaust port 22e is formed below the outer edge of the placement stage 14 in the lower part 12a of the processing container 12. The exhaust port 22e is connected with the exhaust device 52 illustrated in FIG. 8.

With the plasma generation section 22 configured as described above, the reactive gas is supplied to the second region R2 by the gas supply section 76. Further, the microwaves generated by the microwave generator 48 are propagated in the plurality of waveguides 70 and leaks out from the plurality of protrusions 72 to the second region R2. Accordingly, plasma of the reactive gas is generated in the second region R2 and the precursor gas chemically adsorbed onto the substrate W is processed by the plasma of the reactive gas.

In the film forming apparatus 10, the microwaves leaking out from the plurality of waveguides 70 are concentrated on the plurality of protrusions 72 having a restricted area, rather than on the entire region above the second region R2. Accordingly, the plasma-generation positions are concentrated on a location in the vicinity of the plurality of protrusions 72. Accordingly, the film forming apparatus 10 is excellent in controllability of plasma-generation positions. Further, as described above, since the plurality of protrusions 72 are arranged in the radial direction with respect to the axis Z, it is possible to generate plasma in the region extending in the radial direction with respect to the axis Z. Accordingly, according to the film forming apparatus 10, the entire region of the substrate W which rotates around the axis Z may be exposed to the plasma of the reactive gas. Further, as described above, the plurality of protrusions 72 are arranged along the plurality of concentric circles in the film forming apparatus 10. Accordingly, it is possible to expand the plasma-generation region in the circumferential direction with respect to the axis Z.

Further, as described above, in the film forming apparatus 10, the reflection plates 74a of the plungers 74 are provided to face the protrusions 72 through the waveguides 70, that is, the wave guiding paths WG and the distances of the reflection plates 74a from the wave guiding paths WG in the axis Z direction may be adjusted by the position adjustment mechanisms 74b. When the positions of the reflection plates 74a are adjusted in this manner, the peak positions of the stationary waves within the wave guiding paths WG of the waveguides 70 may be adjusted relatively to the positions of the plurality of openings 70h of the waveguides. Accordingly, it becomes possible to relatively adjust the powers of microwaves leaking out to the plurality of protrusions 72 arranged in the radial direction with respect to the axis Z, and further, it is possible to adjust a density distribution of plasma in the radial direction with respect to the axis Z. As described above, in the forming apparatus 10, the circumferential speed of a region on the substrate W which is far from the axis Z is fast compared to that of a region on the substrate W which is near to the axis Z. Accordingly, when the positions of the reflection plates 74a of the plungers 74 are adjusted such that the strengths of the microwaves leaking out to the protrusions 72 become stronger in proportional to the distance from the axis Z, the plasma processing on the substrate W can be uniformized.

Descriptions have been made on the film forming apparatus 10 in detail. As described above, the film forming apparatus 10 has an effect that controllability of a plasma-generation position is excellent. However, the effect may be especially effectively exhibited especially in a case where the pressure inside the processing container 12 is high, for example, 1 Torr (133.3 Pa) or more. Hereinafter, the reasons will be described.

As illustrated in the following Equation (1), behaviors of flows of electrons and ions constituting plasma within the processing container 12 may be represented by the following transport equation.

$$\Gamma = \Gamma_e = \Gamma_i = -D\nabla n \qquad (1)$$

where, plasma is assumed as plasma not containing negative ions. In Equation (1), $\Gamma$, $\Gamma_e$ and $\Gamma_i$ indicate fluxes of plasma, electrons, and ions, respectively, D is a bipolar diffusion coefficient, and n is a plasma density. Further, the bipolar diffusion coefficient D may be represented by the following Equation (2).

$$D = \frac{\mu_i D_e + \mu_e D_i}{\mu_i + \mu_e} \quad (2)$$

In Equation (2), $\mu_e$ and $\mu_i$ are mobilities of electrons and ions, respectively, and $D_e$ and $D_i$ are diffusion coefficients of electrons and ions, respectively. The mobility and diffusion coefficient of particle species s are represented by the following Equation (3) and Equation (4), respectively.

$$\mu_s = \frac{|q_s|}{m_s v_{sm}} \quad (3)$$

$$D_s = \frac{k_B T_s}{m_s v_{sm}} \quad (4)$$

In Equations (3) and (4), $q_s$ is an electric charge amount of particle species s, $k_B$ is a Boltzmann constant, $T_s$ is a temperature of particle species s, $m_s$ is a mass of particle species s, and $v_{sm}$ is collision frequency between particle species s and neural particles. When Equations (3) and (4) are substituted into Equation (2) assuming that all the ions are monovalent cations, the Equation 5 is obtained.

$$D = k_B \frac{T_i + T_e}{m_e v_{em} + m_i v_{im}} \quad (5)$$

Here, when the microwaves having the same power are input in both cases where the pressure inside the processing container 12 is high and where the pressure inside the processing container 12 is low so that the generated amount of electrons and the generated amount of ions are equal to each other, macroscopic fluxes of plasma Γ for both cases are maintained to be identical with each other. Further, when the pressure inside the processing container 12 becomes high, the collision frequency $v_{sm}$ between the particle species s and neutral particles increases, and from Equation (5), when the pressure inside the processing container 12 becomes high, the bipolar diffusion coefficient D becomes smaller than a diffusion coefficient for a case where the pressure inside the processing container 12 is low. Accordingly, in the relationship of Equation (1), in order to make the plasma flux Γ for the case where the pressure inside the processing container 12 is high equal to the plasma flux Γ for the case where the pressure inside the processing container 12 is low, a strong plasma density gradient is needed. Further, a frequency that electrons cause inelastic collisions such as, for example, excitation collisions or ionization collisions increases and thus, a moving distance until the electrons lose energy due to the inelastic collisions after generation is shortened. Therefore, when the pressure inside the processing container 12 becomes high, a plasma localization phenomenon may occur even when it is intended to diffuse plasma in a wide region. Further, when the microwaves are generated within the processing container through a planar dielectric plate having a wide area, a plasma-generation position is determined by a standing wave mode within the dielectric plate. Accordingly, even though a microwave input position is specified by, for example, a slot plate, it is difficult to sufficiently obtain controllability of a plasma-generation position.

In the film forming apparatus 10, since the microwaves are concentrated on the plurality of protrusions 72 which are restricted in the area to be in contact with the second region R2, it is possible to control the plasma-generation position to be located in the vicinity of the protrusion 72 even under a high pressure. Accordingly, the film forming apparatus 10 is excellent in controllability of the plasma-generation position even under the high pressure.

Figure 9:
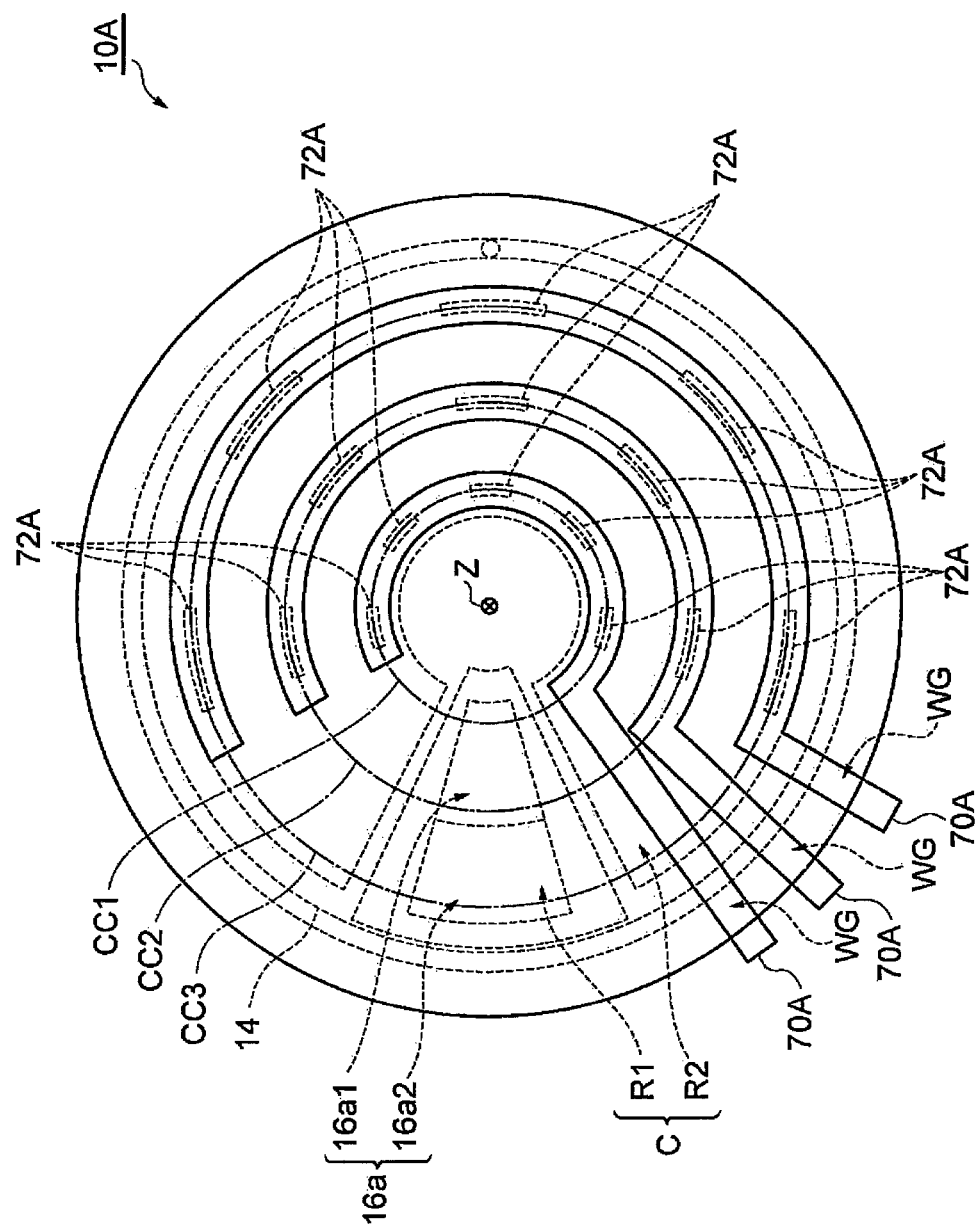
FIG. 9 is a top view schematically illustrating a film forming apparatus according to another embodiment.

Hereinafter, descriptions will be made on a film forming apparatus 10A according to another embodiment with reference to FIG. 9. FIG. 9 is a top view schematically illustrating a film forming apparatus according to another embodiment. The film forming apparatus 10A is different from the film forming apparatus 10 in a configuration of the plasma generation section. The film forming apparatus 10A employs a plurality of protrusions 72A each of which has an arc shape in a cross-sectional view and a belt shape in a plan view orthogonal to the axis Z, unlike the protrusion 72 having a circular columnar shape. The plurality of protrusions 72A are arranged along a plurality of concentric circles (denoted by reference symbols CC1, CC2 and CC3 in the figures) around the axis Z and also arranged in the radial direction with respect to the axis Z.

Further, the film forming apparatus 10A employs a plurality of waveguides 70A extending along the arc formed around the axis Z above the second region R2, unlike the waveguides 70. The waveguides 70A extend along concentric circles parallel to the plurality of concentric circles CC1 to CC3 in which the plurality of protrusions 72A are arranged in the axis Z direction. Openings through which the plurality of protrusions 72A pass are formed in the lower conductive part of the waveguides 70A and the upper part 12b of the processing container 12. Although not illustrated in FIG. 9, the plurality of plungers 74 may also be provided in the film forming apparatus 10A such that the reflection plates 74a face the protrusions 72A through the wave guiding paths WG.

As described above, the plurality of protrusions made of a dielectric material may have any shapes as long as the plurality of protrusions extend from the waveguides with a restricted area within the second region R2.

Figure 10:
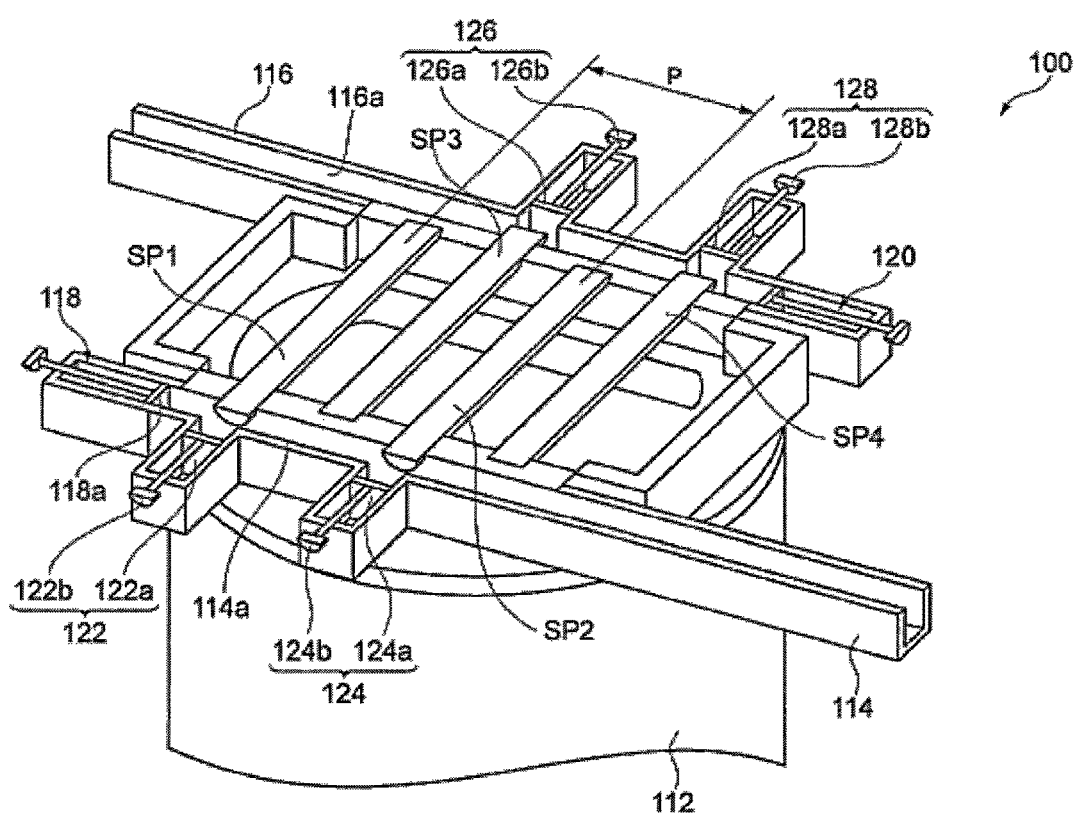
FIG. 10 is a perspective view of a configuration of a plasma processing device utilized in Test Examples.

Hereinafter, descriptions will be made on Test Examples 1 and 2 and a simulation in which it has been verified that a plasma-generation position may be controlled by concentrating microwaves on a dielectric plate which is in contact with a processing region within the processing container with a restricted area. FIG. 10 is a perspective view of a configuration of a plasma processing device utilized in the Experiments.

A plasma processing device 100 illustrated in FIG. 10 is provided with four rods SP1 to SP4 made of a dielectric material above a processing container 112. The rods SP1 to SP4, each of which has a diameter of 40 mm and a length of 353 mm, are arranged in parallel to each other at 100 mm intervals. Further, as illustrated in FIG. 6, the rods are arranged in one direction in this order.

Further, the plasma processing device 100 is provided with two rectangular waveguides 114 and 116. A cross-sectional size of each of the rectangular waveguides 114 and 116 is 109.2 mm×54.6 mm based on EIA standard WR-430. The waveguides 114 and 116 extend in a direction orthogonal to the extending direction of the rods SP1 to SP4 and are provided such that the rods SP1 to SP4 are interposed between the waveguides 114 and 116. The waveguide 114 includes a plunger 118 in the reflecting end thereof and the waveguide 116 includes a plunger 120 in the reflecting end thereof. One end of each of the rods SP1 and SP2 is positioned within the wave guiding path of the waveguide 114 and the other end of each of the rods SP1 and SP2 is terminated in front of the wave guiding path of the waveguide 116. Specifically, one end of each of the rods SP1 and SP2 is introduced into the waveguide 114 by a length of 30 mm. Further, one end of each of the rods SP3 and SP4 is positioned within the wave guiding path of the waveguide 116 and the other end of each of the rods SP3 and SP4 is terminated in front of the wave guiding path of the waveguide 114. Specifically, one end of each of the rods SP3 and SP4 is introduced into the waveguide 116 by a length of 30 mm.

Plungers 122 and 124 are attached to the waveguide 114. The plunger 122 includes a reflection plate 122a and a position adjustment mechanism 122b. The reflection plate 122a faces one end of the rod SP1 through the wave guiding path of the waveguide 114. The position adjustment mechanism 122b has a function of adjusting a position of the reflection plate 122a from one surface (denoted by a reference numeral 114a) of the waveguide 114 which defines the wave guiding path. Further, the plunger 124 includes a reflection plate 124a and a position adjustment mechanism 124b. The reflection plate 124a faces one end of the rod SP2 through the wave guiding path of the waveguide 114. The position adjustment mechanism 124b is capable of adjusting a position of the reflection plate 124a from one surface 114a of the waveguide 114.

Further, plungers 126 and 128 are attached to the waveguide 116. The plunger 126 includes a reflection plate 126a and a position adjustment mechanism 126b. The reflection plate 126a faces one end of the rod SP3 through the wave guiding path of the waveguide 116. The position adjustment mechanism 126b has a function of adjusting a position of the reflection plate 126a from one surface (denoted by a reference numeral 116a) of the waveguide 116 which defines the wave guiding path. Further, the plunger 128 includes a reflection plate 128a and a position adjustment mechanism 128b. The reflection plate 128a faces one end of the rod SP4 through the wave guiding path of the waveguide 116. The position adjustment mechanism 128b is capable of adjusting a position of the reflection plate 128a from one surface 116a of the waveguide 116 which defines the wave guiding path.

In Test Examples 1 and 2, Ar gas was supplied into the processing container 112 of the plasma processing device 100 having the configuration described above and microwaves having a frequency of 2.45 GHz were supplied into the processing container 112 with 1 kW microwave power. Further, in Test Examples 1 and 2, the distance d1 between the reflection plate 122a and one surface of the waveguide 114 and the distance d2 of the reflection plate 124a from one surface of the waveguide 114 were set as parameters and varied. Further, in Test Examples 1 and 2, the distance between the rod SP1 and the rod SP2 was set to 200 mm. Further, in Test Example 1, the pressure inside the processing container 112 was set to 100 mTorr (13.33 Pa) and in Test Example 2, the pressure inside the processing container 112 was set to 1 Torr (133.3 Pa). Further, the distance between the reflection plate 118a of the plunger 118 and the axis of the rod SP1 was set to 85 mm.

Figure 11:
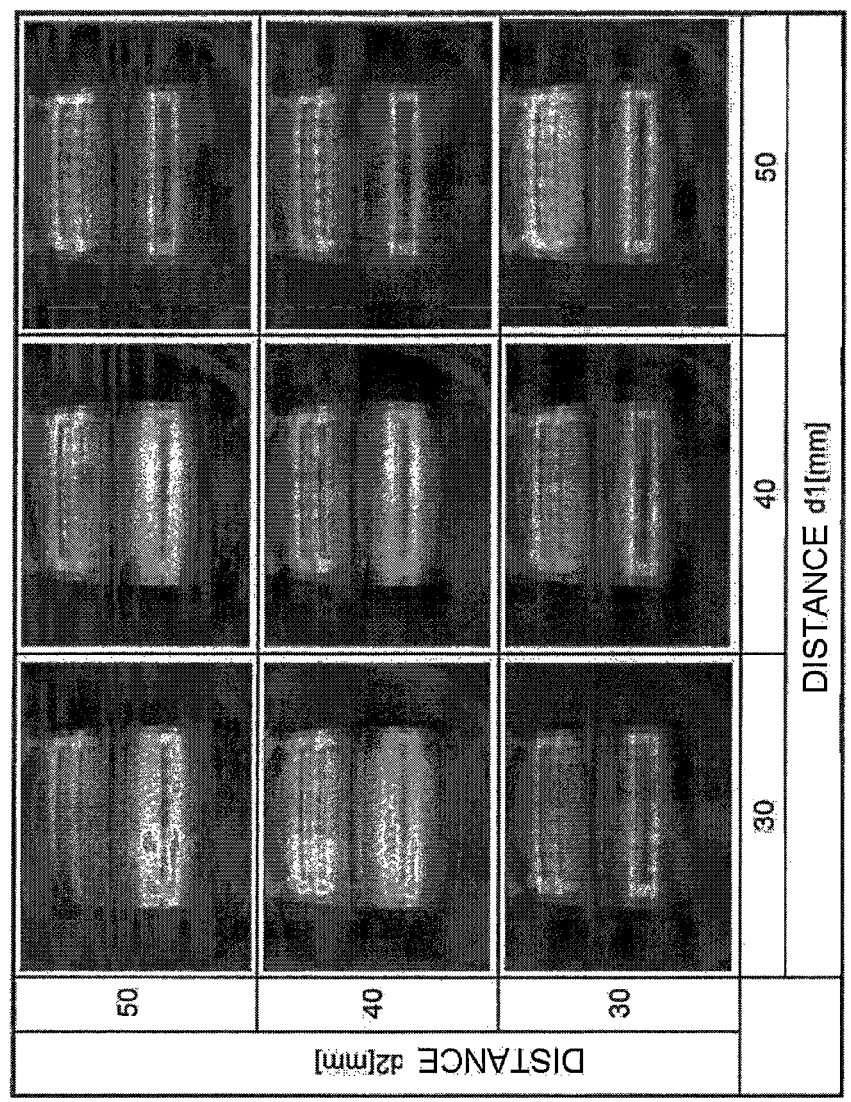
FIG. 11 is a view illustrating images of light-emitting states of plasma in Text Example 1.
Figure 12:
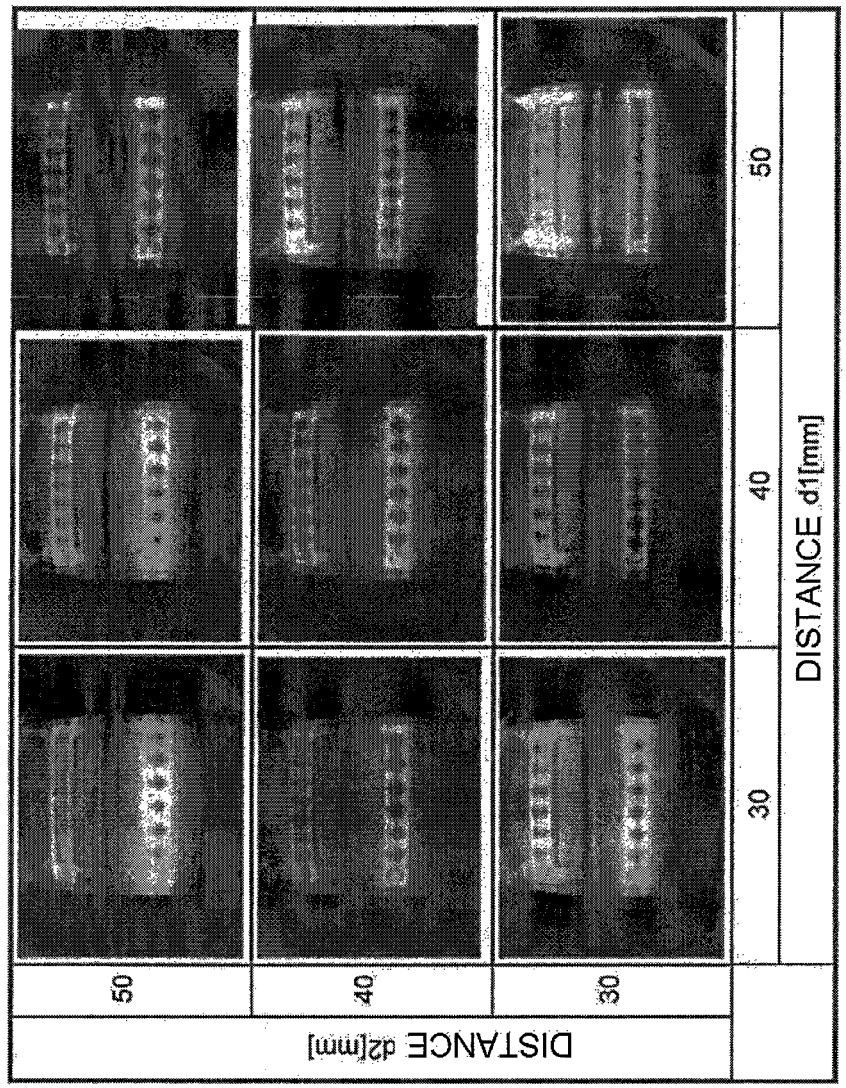
FIG. 12 is a view illustrating images of light-emitting states of plasma in Test Example 2.

Also, in both Test Examples 1 and 2, a light-emitting state of plasma was photographed from the underside of the rods SP1 and SP2. FIG. 11 is a view illustrating images of light-emitting states of plasma in Test Example 1 and FIG. 12 is a view illustrating images of light-emitting states of plasma in Test Example 2. FIGS. 11 and 12 illustrate the images obtained by photographing the light-emitting states of plasma under the setting values of the distance d1 and the distance d2 in a matrix form.

In the images illustrated in FIGS. 11 and 12, a portion with a relatively high brightness indicates light emission of plasma located in the vicinity of the rods SP1 and SP2. Accordingly, from results of Test Examples 1 and 2, it has been found that the plasma-generation positions may be controlled to be located in the vicinity of the rods SP1 and SP2. From this, it has been found that the plasma-generation positions may be concentrated on the vicinity of a member made of a dielectric material and extending from the wave guiding path due to a configuration in which the member is in contact with the processing region inside the processing container with a restricted area.

Further, as illustrated in FIGS. 11 and 12, it has been found that the distances d1 and d2, that is, the distance of the reflection plate 122a from the wave guiding path of the waveguide 114 and the distance of the reflection plate 124a from the wave guiding path of the waveguide 114 are adjusted such that a ratio of brightness of plasma located in the vicinity of the rod SP1 and brightness of plasma located in the vicinity of the rod SP2 are relatively varied. Accordingly, from the results of Test Examples 1 and 2, it has been found that the distances d1 and d2 are adjusted such that a ratio of plasma density in the vicinity of the rod SP1 and plasma density in the vicinity of the rod SP2 may be adjusted. From this, it has been confirmed that in the configuration in which the plurality of members made of a dielectric material and extending from the wave guiding path are in contact with the processing region inside the processing container in a restricted area, the distances of the reflection plates of the plungers from the wave guiding paths are adjusted such that the density distribution of plasma concentrated in the vicinity of the members made of a dielectric material may be adjusted.

Figure 13:
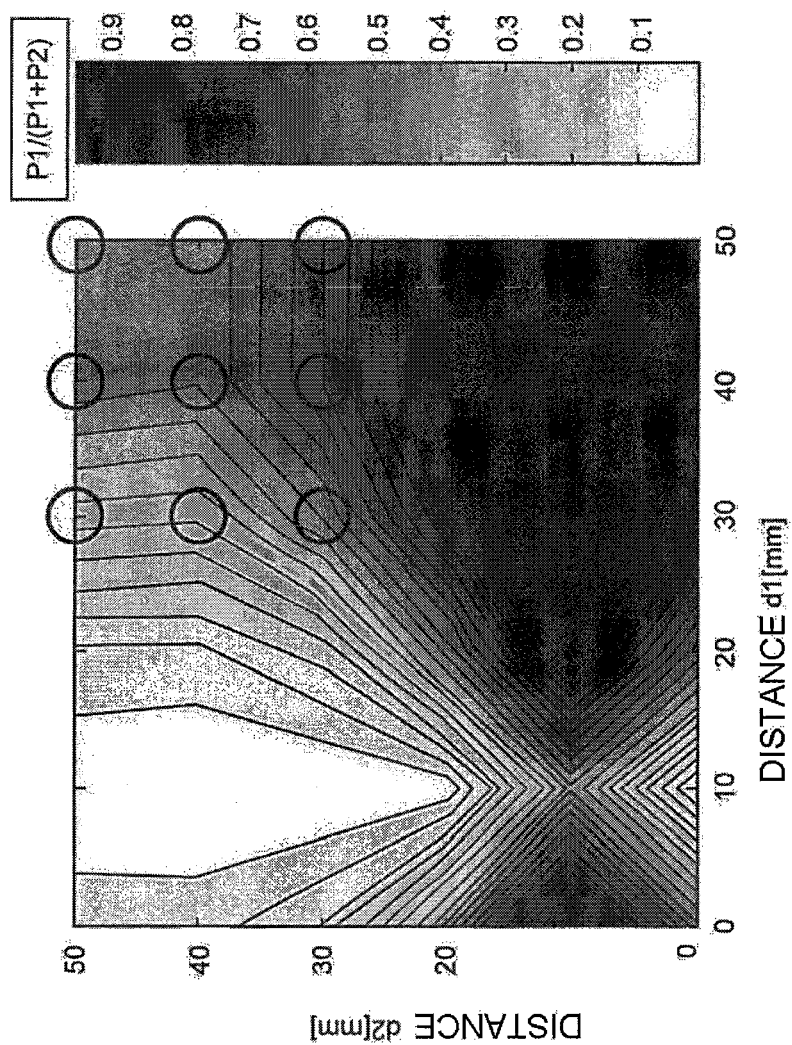
FIG. 13 is a view illustrating an electric field intensity ratio of the plasma processing device illustrated in FIG. 10 obtained by a simulation.

Further, by a simulation, the electric field strengths of the plasma processing device 100 was calculated using the same settings as those of Test Examples 1 and 2. In the simulation, the distance d1 and the distance d2 were set as parameters and varied, and an electric field strength P1 within the rod SP1 and an electric field strength P2 within the rod SP2 were calculated to obtain P1/(P1+P2) as a ratio of the electric field strengths. The result is illustrated in FIG. 13. In FIG. 13, the horizontal axis indicates a setting value of the distance d1 and the vertical axis indicates a setting value of the distance d2. FIG. 13 illustrates the ratios of the electric field strengths P1/(P1+P2) obtained by performing the calculation under the setting values of the distance d1 and the distance d2 in corresponding with the setting values of the distance d1 and the distance d2. Further, in FIG. 13, the ratios of the electric field strengths P1/(P1+P2) obtained under the same setting values as the setting values of the distance d1 and the distance d2 of Test Examples 1 and 2 are surrounded by circles. As a result of the simulation, it has been found that the ratios of electric field strength P1/(P1+P2) of the portions surrounded by the circles are matched with the light emission states of plasma in Test Examples 1 and 2. Further, as illustrated in FIG. 13, from the result of the simulation, it has also been found that when the distances of the reflection plates of the plungers from the wave guiding paths are adjusted, the density distribution of plasma concentrated in the vicinity of a plurality of members made of a dielectric material may be adjusted.

As described above, although various embodiments have been described, the present invention is not limited to the embodiments described above and various modifications may also be made thereto. For example, the number of the waveguides and the plurality of protrusions made of a dielectric material illustrated in FIGS. 1 to 3 and FIG. 9, the shapes and arrangements thereof are illustrative only and may be changed arbitrarily as long as the effects described above may be exhibited. Further, although the precursor gas injection part including two gas shower portions has been exemplified in the embodiment described above, the precursor gas injection part may include three or more gas shower portions in regions located at different distances from the axis. Further, the gas supply section for a precursor gas may be configured such that the flow rates of the precursor gas for three or more gas shower portions may be individually adjusted.

DESCRIPTION OF SYMBOLS 10 film forming apparatus, 12: processing container, 14: placement stage, 14a: substrate placing region, 16: gas supply section (precursor gas), 16a: injection part, 16a1, 16a2: gas shower portion, 16h: injection port, 18: exhaust section, 18a: exhaust port, 20: gas supply section (purge gas), 20a: injection port, 22: plasma generation section, 24: driving mechanism, 48: microwave generator, 70: waveguide, 70a: lower conductive part, 70h: opening, 72: protrusion, 74: plunger, 74a: reflection plate, 74b: position adjustment mechanism, 76: gas supply section (reactive gas), C: processing chamber, R1: first region, R2: second region, WG: wave guiding path, Z: axis (rotation axis).

What is claimed is:

1. A film forming apparatus comprising:
   a placement stage including a plurality of substrate placing regions and provided to be rotatable around an axis such that the plurality of substrate placing regions are moved in a circumferential direction;
   a processing container configured to define a processing chamber which accommodates the placement stage and includes a first region and a second region, the substrate placing regions sequentially passing through the first region and the second region while moving in the circumferential direction with respect to the axis by rotation of the placement stage;
   a gas supply section configured to supply a precursor gas to the first region from an injection part provided to face the placement stage; and
   a plasma generation section configured to generate plasma of a reactive gas in the second region,
   wherein the plasma generation section includes:
   a plurality of waveguides, each of which is configured to define a waveguide path above the placement stage and above the second region, wherein the plurality of waveguides each include a lower conductive part and a plurality of openings formed in the lower conductive part,
   a microwave generator connected to the plurality of waveguides, and
   a plurality of protrusions made of a dielectric material and configured to pass through the plurality of openings formed in the lower conductive part of the plurality of waveguides to extend into the second region, the plurality of waveguides extending radially towards the axis, and wherein the microwaves generated by the microwave generator are propagated in the plurality of waveguides and leak out from the plurality of protrusions to the second region,
   wherein each of the plurality of protrusions are arranged to be aligned in a radial direction with respect to the axis along a corresponding one of the plurality of waveguides toward the axis,
   wherein each of the plurality of protrusions has a rod shape, and
   wherein an upper end of each of the plurality of protrusions extends into a corresponding waveguide path.

2. The film forming apparatus of claim 1, further comprising:
   a plurality of plungers provided to face waveguide side ends of the plurality of protrusions through the plurality of waveguides,
   wherein each of the plurality of plungers includes a reflection plate capable of adjusting a distance from the corresponding waveguide.

3. The film forming apparatus of claim 1, wherein each of the plurality of protrusions has an arc shape in a cross-section orthogonal to the axis.

4. The film forming apparatus of claim 1, wherein the plurality of waveguides each extend across a plurality of concentric circles.

5. The film forming apparatus of claim 1, wherein the plurality of waveguides radially extend toward the axis.

6. The film forming apparatus of claim 1, wherein the injection part includes a plurality of gas shower portions provided in regions located at different distances with respect to the axis, and each of the plurality of gas shower portions includes one or more injection ports, and
   the gas supply section is configured to individually adjust flow rates of the precursor gas injected from the plurality of gas shower portions.

7. The film forming apparatus of claim 1, wherein the plurality of waveguides each extend across a plurality of concentric circles, with the plurality of protrusions of each waveguide positioned on a different one of the plurality of concentric circles.

8. The film forming apparatus of claim 7, wherein each concentric circle has plural protrusions positioned there along respectively from different waveguides of the plurality of waveguides.

9. The film forming apparatus of claim 1, wherein the plurality of protrusions are isolated from each other.

10. A film forming apparatus comprising:
    a placement stage including a plurality of substrate placing regions and provided to be rotatable around an axis such that the plurality of substrate placing regions are moved in a circumferential direction;
    a processing container configured to define a processing chamber which accommodates the placement stage and includes a first region and a second region, the substrate placing regions sequentially passing through the first region and the second region while moving in the circumferential direction with respect to the axis by rotation of the placement stage;
    a gas supply section configured to supply a precursor gas to the first region from an injection part provided to face the placement stage; and
    a plasma generation section configured to generate plasma of a reactive gas in the second region,
    wherein the plasma generation section includes:
    at least one waveguide configured to define a waveguide path above the placement stage and above the second region,
    a microwave generator connected to the at least one waveguide, and a plurality of protrusions made of a dielectric material and configured to pass through a plurality of openings formed in a lower conductive part of the at least one waveguide to extend into the second region, the plurality of openings extending radially towards the axis, and wherein the microwaves generated by the microwave generator are propagated in the at least one waveguide and leak out from the plurality of protrusions to the second region, wherein the plurality of protrusions are arranged in a radial direction with respect to the axis, wherein each of the plurality of protrusions has a rod shape, and wherein an upper end of each of the plurality of protrusions extends into a corresponding opening of the at least one waveguide.

11. The film forming apparatus of claim 10, wherein the plurality of protrusions are isolated from each other.

* * * * *